United States Patent [19]

Abe et al.

[11] Patent Number: 4,786,823

[45] Date of Patent: Nov. 22, 1988

[54] NOISE PULSE SUPPRESSING CIRCUIT IN DIGITAL SYSTEM

[75] Inventors: Masato Abe, Sagamihara; Fumitaka Asami, Kunitachi, both of Japan

[73] Assignee: Fujitsu Limited, Kanagawa, Japan

[21] Appl. No.: 39,337

[22] Filed: Apr. 17, 1987

[30] Foreign Application Priority Data

Apr. 18, 1986 [JP] Japan .................. 61-89599

[51] Int. Cl.$^4$ ............................. H03K 5/22
[52] U.S. Cl. ..................... 307/234; 307/520; 328/111
[58] Field of Search ............. 307/234, 517, 520; 328/111, 165

[56] References Cited

U.S. PATENT DOCUMENTS 3,753,135  8/1973  Kastner et al. .............. 328/111 X Primary Examiner—Eugene R. Laroche
Assistant Examiner—Steven J. Mottola
Attorney, Agent, or Firm—Armstrong, Nikaido, Marmelstein & Kubovcik

[57] ABSTRACT

Noise pulses having both polarities which are superposed on an input signal having a binary state of H/L levels forming a rectangular waveform, are suppressed or eliminated before transferring the input signal to an output stage. A noise pulse suppressing circuit is provided which comprises a latch circuit, a counter circuit, and a logic circuit including NAND gates and INVERTERs. For the latch circuit and the counter circuit, D-type flip-flops are also utilized. The input signal is inputted to a data input terminal of a flip-flop of the latch circuit and outputted from the data output terminal thereof. The latch circuits are triggered by a pulse signal applied to a clock terminal thereof. The above triggering pulse signal is generated by the counter circuit and the logic circuit, and it has a short pulse waveform responding to the input signal but delayed. No pulse in the output is produced which corresponds to the noise pulses in the input signal.

9 Claims, 8 Drawing Sheets

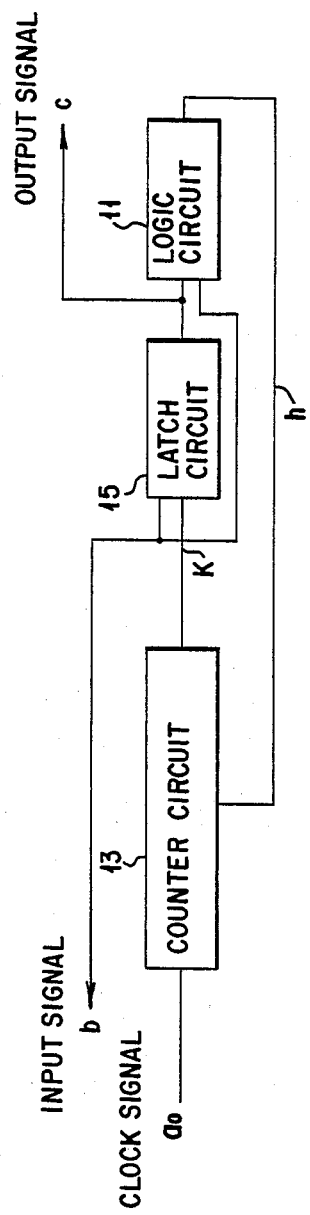
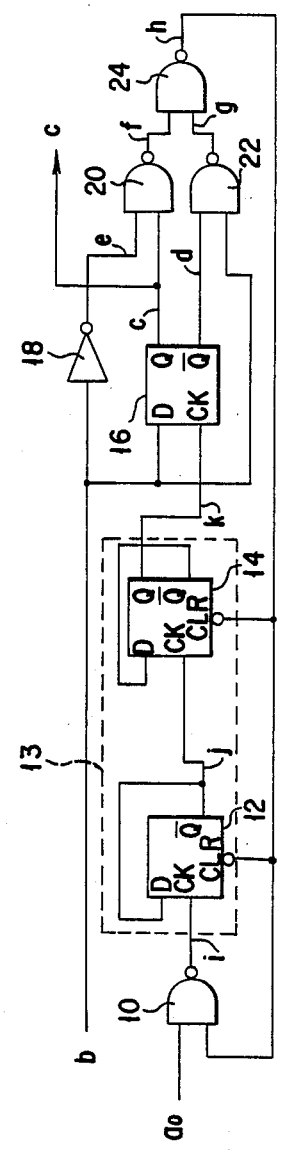
FIG.1
FIG.2

NOISE PULSE SUPPRESSING CIRCUIT IN DIGITAL SYSTEM

BACKGROUND OF THE INVENTION

1. Field of the Invention

The present invention relates to a noise pulse suppressing circuit in a digital system. More particularly, this invention relates to a circuit, which has the function of suppressing noise pulses having either positive or negative polarity, or having both polarities. The maximum pulse width of the noise to be suppressed can be determined by the frequency of a clock signal or by a counter circuit used in the circuit.

2. Description of the Prior Art

When an input signal, which assumes alternatively high and low levels (abbreviated hereinafter as H and L levels) forming a rectangular waveform, includes noise pulses, it is preferable to suppress or eliminate the noise pulses and transfer the input signal to the next stage without noise by introducing a noise suppressing circuit.

When the noise pulse has a width of short duration, a noise suppressing circuit comprising a shift register and other logic elements may be used by utilizing a characteristic of the short pulse width.

However, the noise pulse suppressing circuit conventionally used has the capability of suppressing noise pulses having only one polarity, namely, either positive or negative polarity. Therefore, the conventional circuit cannot be used to suppress noise pulses having both polarities.

SUMMARY OF THE INVENTION

It is a general object of the invention, therefore to provide a noise pulse suppressing circuit.

It is a more specific object of the invention to provide a circuit which suppresses noise pulses having both positive and negative polarities, the pulses being in an input signal.

It is another object of the invention to obtain an output pulse signal having a leading edge which is synchronized with either the leading or trailing edge of a clock signal.

It is still a further object of the invention to make it possible to determine the maximum pulse width of a noise pulse which should be suppressed.

The foregoing objects are accomplished by the present invention which comprises a latch circuit, a counter circuit, and logic circuit including elements such as NAND gates, INVERTERs and OR gates.

FIG. 1 shows a block diagram for explaining the principle of the present invention. The input signal b is input to a latch circuit 15 comprising a D-type flip-flop and an output signal c is output from the data output terminal thereof. The latch circuit is triggered by a pulse trigger signal k.

The trigger signal k is generated by a counter circuit 13, and the counter circuit 13 comprises plural D-type flip-flops. Counter circuit 13, having a clock signal $a_o$ as an input signal, is controlled by an output signal h output from a logic circuit 11.

Logic circuit 11 comprises, for example, NAND gates, and an INVERTER. Counter circuit 13 generates a trigger signal k, in response to clock signal $a_o$ and is controlled by signal h. The trigger signal k is generated only at the instants corresponding to edges of the input signal pulse b. The pulse in signal k has a predetermined delay time.

The circuit described above avoids generating a trigger pulse in signal k in response to the noise pulse included in the input signal b.

Details of the performances and the modifications of the present invention will become clear from a reading of the detailed description of the invention with reference to the drawings.

BRIEF DESCRIPTION OF THE DRAWINGS

FIG. 1 shows a block diagram for explaining the principle of the present invention.

FIG. 2 shows a logic diagram of an embodiment of the present invention wherein an output signal is triggered by the trailing (negative) edge of a clock signal, and two flip-flops are used in a counter circuit.

FIGS. 3, 4 and 5 show timing charts for the embodiment shown in FIG. 2, wherein FIG. 3 shows when the input signal does not include noise pulses, FIG. 4 shows when the input signal includes noise pulses having negative polarity, and FIG. 5 shows when the input signal includes noise pulses having positive polarity.

FIGS. 9 and 10 show timing charts for the embodiment shown in FIG. 8, wherein FIG. 9 shows when the input signal includes noise pulses having negative polarity, and FIG. 10 shows when the input signal includes noise pulses having positive polarity.

DETAILED DESCRIPTION OF THE PREFERRED EMBODIMENT

Figure 3:
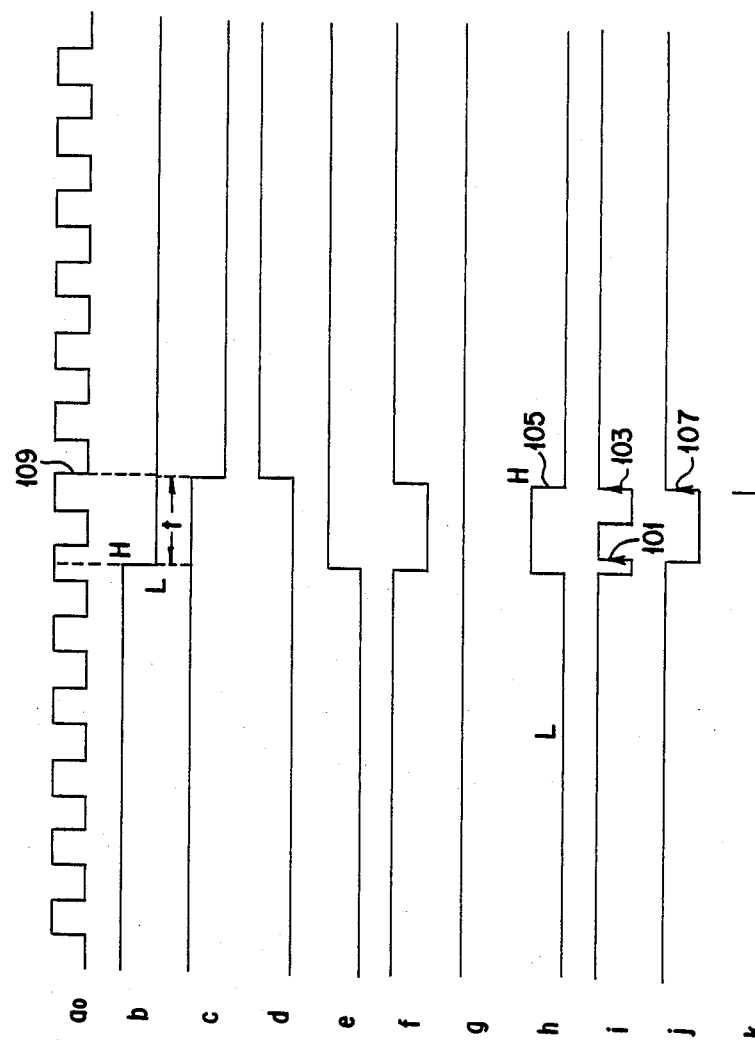
Figure 4:
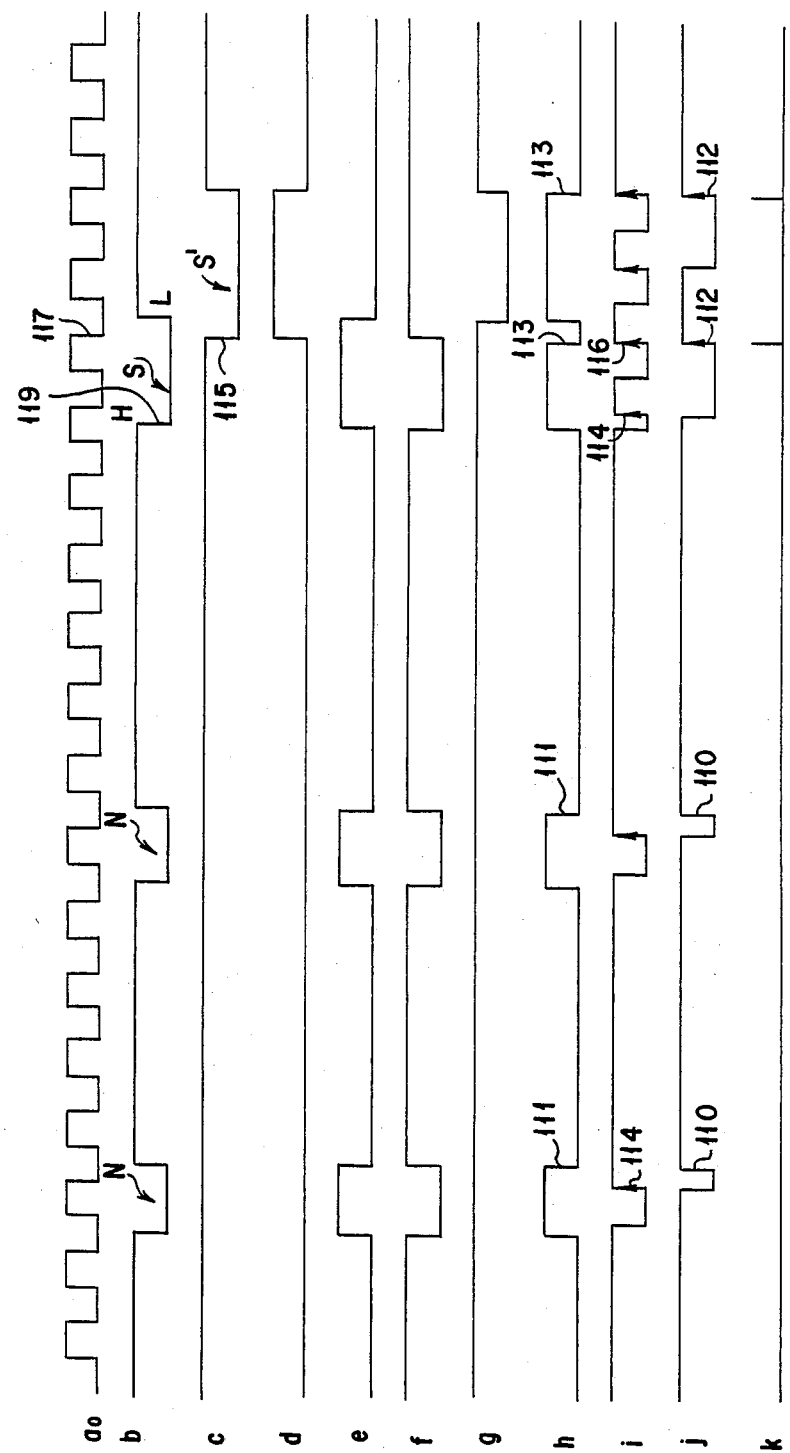
Figure 5:
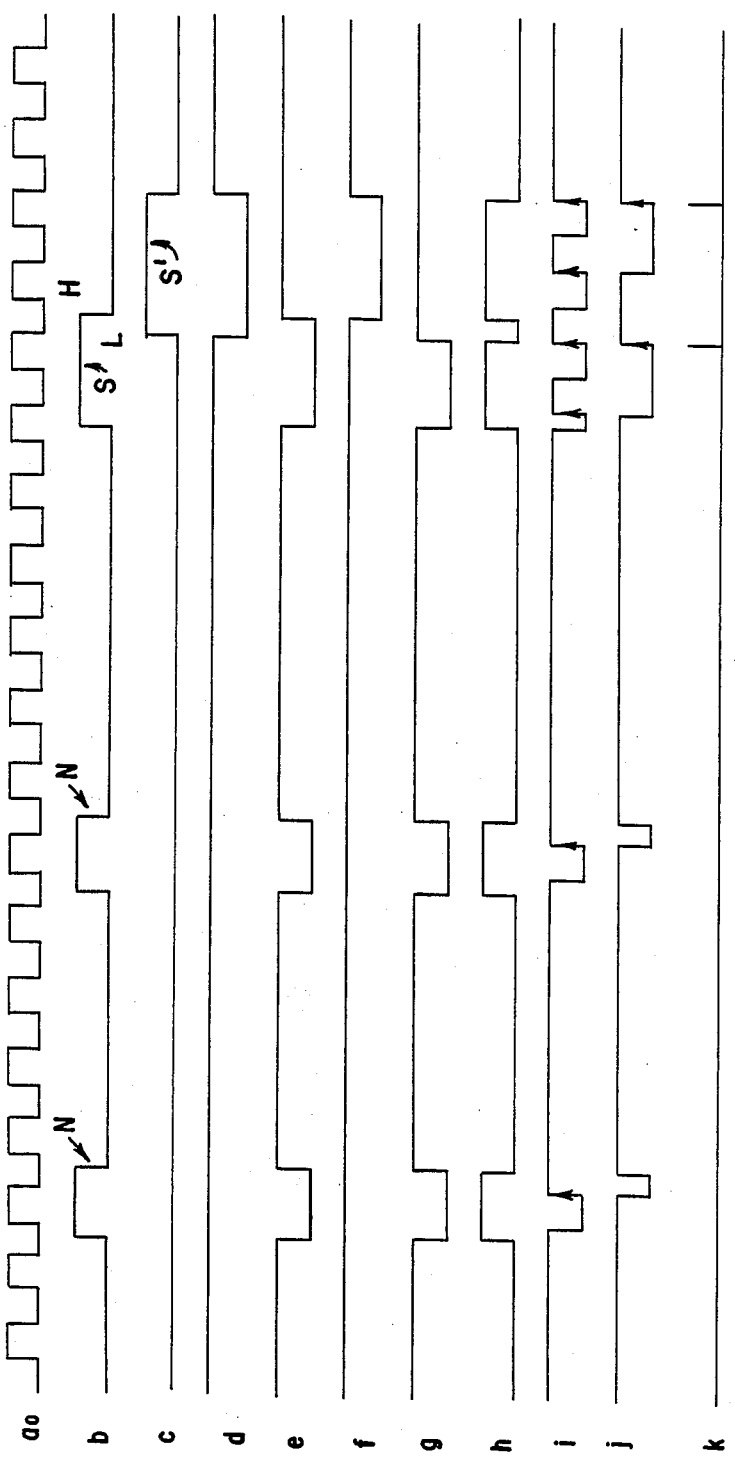

FIG. 2 shows an embodiment of a logic circuit diagram according to the present invention. A latch circuit 16 and counters 12 and 14 comprise D-type flip-flops respectively. FIGS. 3 through 5 show timing charts corresponding to each respective line or terminal shown in FIG. 2.

The timing chart of FIG. 3 shows the case of a normal input signal without a noise pulse. FIG. 4 shows an example in which the input signal has a narrow noise pulse having a negative polarity during a H level portion of the input signal, and FIG. 5 shows an example in which the input signal has narrow noise pulse having a positive polarity during a L level portion of the input signal.

In a normal operating condition without noise pulses, such as shown in FIG. 3, the input signal has a waveform shown by b. A clock signal $a_o$ has a rectangular waveform having a duty factor of 50% and repeating periodic changes between H and L levels alternatively. The pulse width at H and L levels of input signal b are assumed to be much longer than a period of the clock signal $a_o$.

The output signal c generated by the latch circuit of the present invention is obtained from a data output terminal Q of flip-flop 16, and has a waveform which is latched and delayed from the input signal b, and has a delay time which begins at the instant the input signal changes and ends at the second trailing edge of the clock signal $a_o$. Therefore, the flip-flop 16 has the function of latching and delaying.

The output d at an inverted terminal ($\bar{Q}$ terminal) is an inverted waveform of the output signal c as shown in FIG. 3. Logic circuit 11 in FIG. 1 consists of three NAND gates and an INVERTER. The output e of an INVERTER 18 is an inverted waveform of the input signal b, and the output signal f is an output of a first NAND gate 20, having input signals c and e, and the output signal g is an output of a second NAND gate 22, having input signals b and d. Further, f and g are input to a third NAND gate 24 resulting in the output h. Waveforms e, f, g, and h are also shown in FIG. 3.

The clock signal $a_o$ and the signal h are input to input terminals of a fourth NAND gate 10, and NAND gate 10 outputs signal i shown in FIG. 3. Signal i has an inverted waveform of clock signal pulse $a_o$ only when the signal h is at H level. In other words, NAND gate 10 has the function of controlling the counter circuit 13 to operate only during the H level of signal h.

A counter circuit 13 comprises two flip-flops 12 and 14, each data input terminal D being connected to its own output terminal $\bar{Q}$. Flip-flop 12 has a function of generating a signal j, and flip-flop 12 toggles the data $\bar{Q}$ triggered by signal i at the trailing (positive-going) edge 101 thereof. Signal j is input to clock terminal CK of flip-flop 14, and signal j inverts its state at the second trailing (positive-going) edge 103 of signal i. The second trailing edge 103 is almost equal to the trailing edge 105 of signal h, which is input to reset terminals (CLR terminals) of the flip-flops 12 and 14, and has a function of resetting the flip-flops. As shown in FIG. 3, the signal j has one pulse during the corresponding period of two pulses of signal i, therefore the flip-flop 12 has a function of dividing the pulse frequency by two.

Data input terminal (D terminal) of flip-flop 14 is also connected to its inverted output terminal ($\bar{Q}$ terminal), therefore flip-flop 14 toggles its $\bar{Q}$ state at the trailing (positive-going) edge 107 of signal j and resets at the trailing edge 105 of signal h. The signal k having a spike-like pulse is thus formed. In the figure, trailing edge 107 of signal j seems to be coincident with the trailing edge 105 of signal h, however, the trailing edge 107 of j is synchronous with the edge of clock signal $a_o$, but the trailing edge 105 of signal h is formed through the subsequent following stages. Therefore, the trailing edge 107 is advanced by an infinitesimal short time ahead of the trailing edge 105 of signal h, and thus signal k having a short pulse duration is generated.

The flip-flop 16, which functions as a latch circuit, is triggered by the pulse signal k, and toggles and latches input signal b. Therefore the output signal c has a delayed waveform, having a delayed time t as shown in FIG. 3, and t begins at the instant of a change of input signal and ends at the second trailing (negative) edge 109 of clock signal $a_o$.

When the noise pulses are superposed on a H level of input signal b, the detailed performances of the present invention are explained using the timing chart shown in FIG. 4. Noise pulses are shown by an arrow denoted as N on the input signal b. The clock signal has the same rectangular waveform with a duty factor 50% as explained in FIG. 3 and is inputted to one of the input terminals of NAND gate 10. The data input signal b has a H level and L level, each having a longer duration than one period of clock signal $a_o$. In this case, noise pulses, having a negative polarity and a shorter pulse width, are superposed on H level of input signal.

At first, the results of the noise suppressing circuit of the present invention are outlined. As seen in FIG. 4, output signal c is output from data output terminal Q of flip-flop 16, and signal pulse S in input signal b is transferred as signal pulse S′ in output signal c. The leading (negative) edge 115 of S′ coincides with the second trailing (negative) edge 117 of clock signal $a_o$, starting at the leading (negative) edge 119 of signal pulse S. In other words, when the signal pulse S has a duration exceeding the second trailing (negative) edge of the clock signal, then the data pulse is transferred to the output signal, however, signals such as noise pulses shown by N, which encounters only one trailing edge, are disregarded.

The fundamental operation is just the same as explained previously except for the effects of noise pulses. Waveform d from output terminal $\bar{Q}$ of flip-flop 16 is an inverted waveform of output signal c. The signal e of INVERTER 18 is an inverted waveform of the signal b, and the signal f is an output of NAND gate 20, having signals c and e for input signals. The signal g is an output of NAND gate 22 having signals b and d for input signals. Further signals f and g are input to NAND gate 24 resulting in forming the output h. Waveform of signals e, f, g, and h are also shown in FIG. 4.

As shown by the waveforms of b, c, and h in FIG. 4, waveform h has a H level while signals b and c have the opposite (complementary) logic states and waveform h has an L level while b and c have the same logic state.

Both the clock signal $a_o$ and the signal h are input to the input terminals of NAND gate 10, and NAND gate 10 outputs signal i shown in FIG. 4, which takes an inverted waveform of clock signal pulse $a_o$ only when the signal h is at H level.

Flip-flop 12 has a function of generating a signal j, and signal i toggles the data $\bar{Q}$ triggered at the trailing (positive) edge 114 of signal i, and inverts its state at the trailing (negative) edge 111 of signal h, or the second trailing (positive) edge 116 of signal i.

The flip-flop 14 toggles its $\bar{Q}$ state at the trailing (positive) edge 112 of signal j and resets at the trailing edge 113 of signal h. Then signal k having spike-like pulses is generated.

In signal k shown in FIG. 4, the spike pulse responding to noise pulses N is not observed, and only two spike pulses are generated corresponding to leading and trailing edges of output signal S′. The reason is as follows; the trailing (positive) edge 110 of signal j coincides with the trailing edge 111 of signal h, which further coincides with that of noise pulse N, therefore, when flip-flop 14 is going to toggle $\bar{Q}$ triggered by the trailing edge 110, flip-flop 14 receives at the same time a reset signal of trailing edge 111, resulting in no toggle action and no spike pulse in signal k.

However, the subsequent trailing edges 112 of signal j are synchronous with a state change of clock signal $a_o$, and are ahead of trailing edges 113 respectively, therefore $\bar{Q}$ of flip-flop 14 is toggled and is immediately thereafter reset. The signal k appearing on a Q terminal of flip-flop 14 produces two spike-like pulses. Output signal c can be obtained from the output terminal Q of the flip-flop 16 applying the signal k to the CK terminal thereof. Consequently, output signal c has no noise pulse and is synchronous with the clock signal.

FIG. 5 shows a timing chart when input signal b comprises noise pulse N of positive polarity during a L level portion of input signal. In FIG. 5, signals c through k are shown respectively, where output signal c is a rectangular signal having a delay time, and it has no noise pulse and is synchronous with clock signal $a_o$.

In FIG. 5, input signal b has an inverted waveform with respect to that shown in FIG. 4. Comparing FIG. 5 to FIG. 4, signals c and d in FIG. 5 have inverted waveforms as compared to those shown in FIG. 4, signals f and g are exchanged with each other, and signals h, i, and j are the same for both cases. As a result, the noise suppressing circuit as disclosed above has the function of suppressing noise pulses having both polarities.

In FIGS. 3 through 5, input signal b is transferred to output signal c and is delayed to the second trailing (negative) edge of clock signal $a_o$ from the change of state (H/L) of the input signal. However, it is possible to modify the circuit to utilize the leading (positive) edge of a clock signal, and also the number of clock pulses included in the delay time between signals b and c can be changed by modifying a counter circuit.

Figure 6:
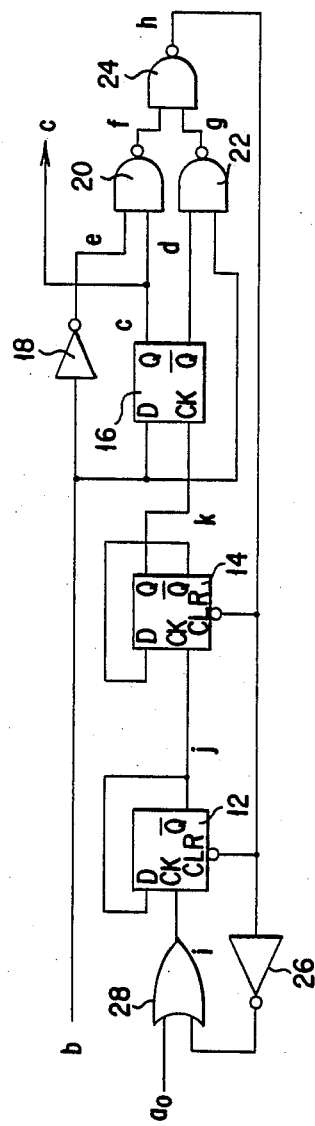
FIG. 6 shows a logic diagram of another embodiment utilizing the leading (positive) edge of a clock signal.
Figure 7:
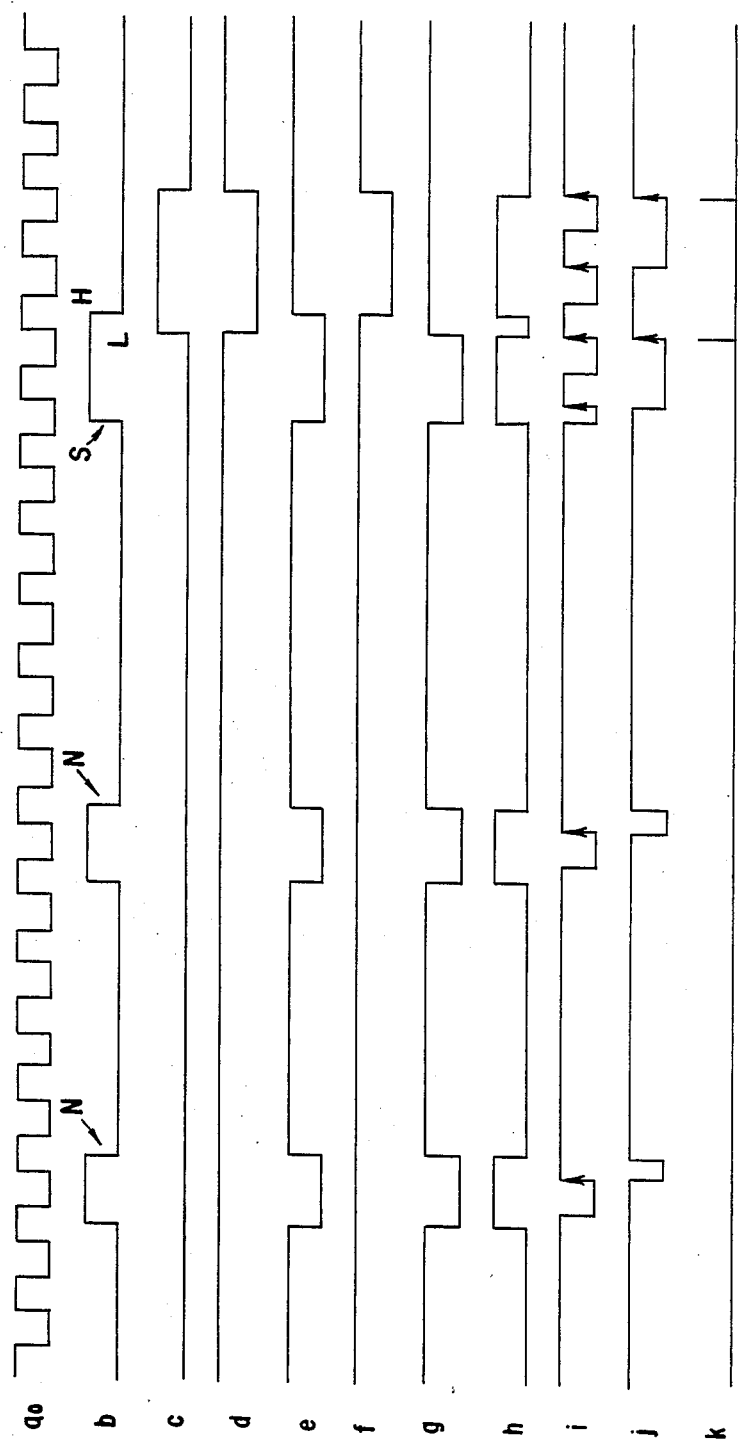
FIG. 7 shows a timing chart corresponding to the logic diagram shown in FIG. 6.

FIG. 6 shows a circuit for using a leading (positive) edge of clock signal $a_o$, and FIG. 7 shows a timing chart therefor. In this case, INVERTER 26 and OR gate 28 are used instead of NAND gate 10 in FIG. 2.

Waveforms of signals b through k are completely the same as those shown in FIG. 5, and only clock signal $a_o$ shows an inverted waveform as compared to $a_o$ in FIG. 5. This means that the leading edge of output signal c is triggered by the leading (positive) edge of clock signal $a_o$.

Figure 8:
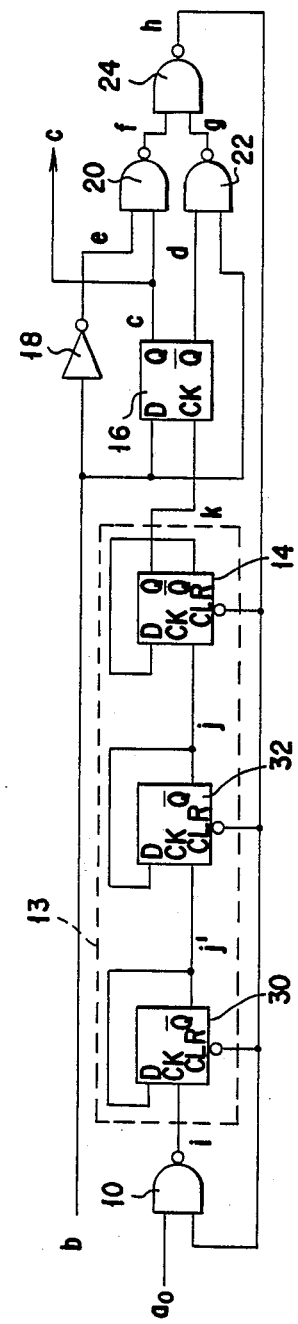
FIG. 8 shows a logic diagram of still another embodiment utilizing three flip-flops in the counter circuit.

FIG. 8 shows a noise pulse suppressing circuit using a counter circuit, which consists of three flip-flops 30, 32 and 14.

Figure 9:
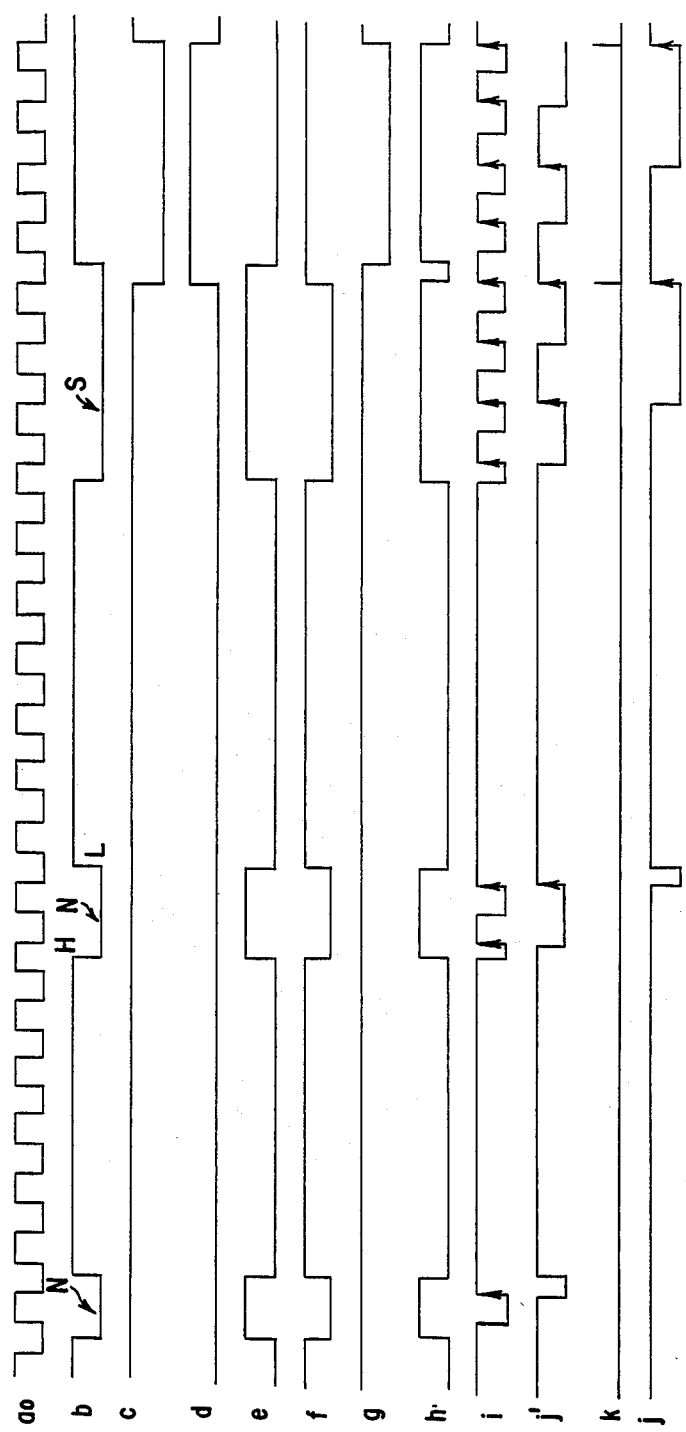
Figure 10:
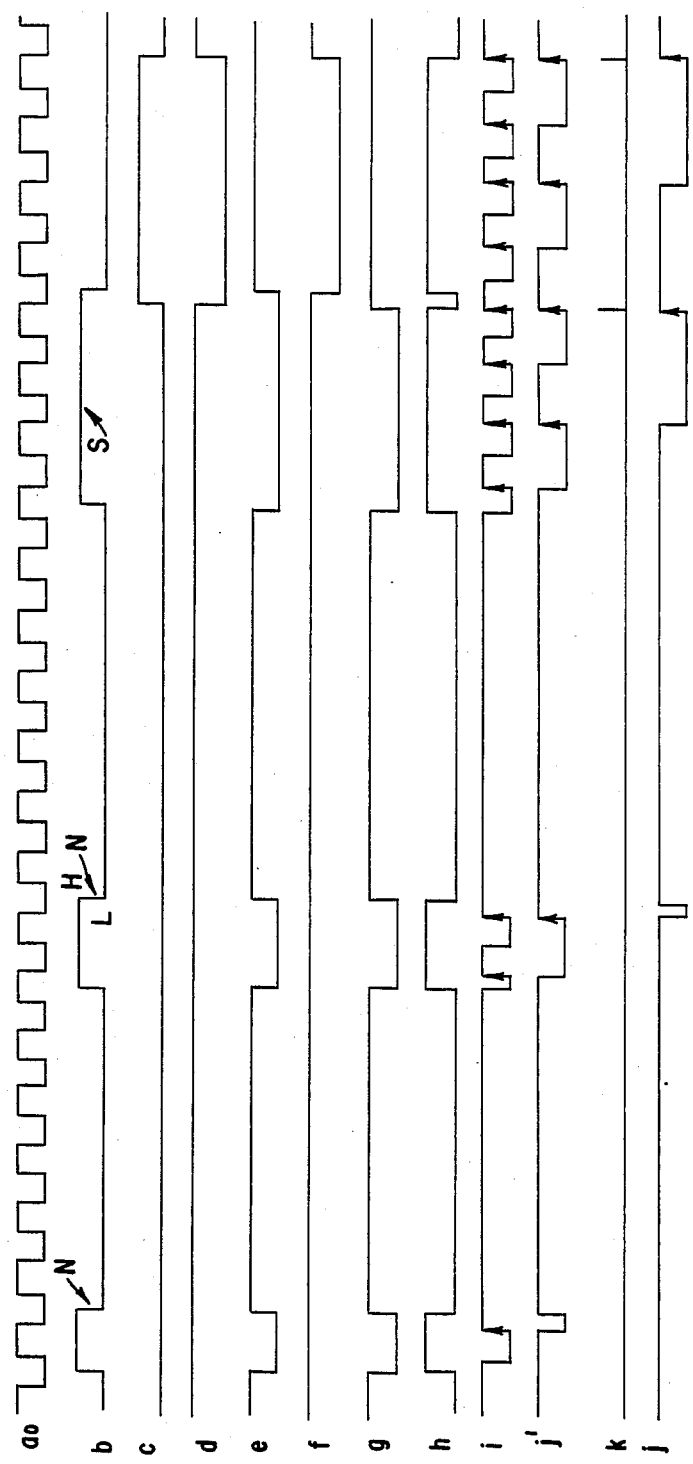

The timing chart for the case when the input signal b includes noise pulses having negative polarity during the H level portion of the input signal, is shown in FIG. 9, and the timing chart for the case when the input signal includes noise pulses having positive polarity during the L level portion of the input signal, is shown in FIG. 10.

In these cases, the clock signal includes 4 trailing (negative) edges during the signal pulse S of input signal b, and it is necessary that the noise pulse duration does not exceed the time in which the trailing edges of clock signal appear two times.

In FIGS. 9 and 10, waveform j' is added which displays the waveform on the connection line between two flip-flops 30 and 32. As seen from waveforms of i, j', and j, the number of pulses is successively decreased to a half.

A noise suppressing circuit according to the present invention, as disclosed above, has the following features:

(a) suppressing noise pulses having both positive and negative polarities;
(b) transferring an input signal to an output circuit in synchronization with a clock signal;
(c) making it possible to utilize either the leading edge or trailing edge of the clock signal for synchronization of the output signal; and
(d) making it possible to determine the maximum width of a noise pulse by selecting the frequency of the clock signal or the number of flip-flops used in the counter circuit.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalency of the claims are, therefore, to be embraced therein.

What we claim is as follows:

1. A noise pulse suppressing circuit for suppressing a noise pulse superposed on an input signal having binary states, and outputting an output signal responsive to a respective binary state of the input signal without the noise pulse, said noise pulse suppressing circuit comprising:

a latch circuit means for receiving and latching the input signal in response to a triggering signal, and outputting the output signal;

a counter circuit means, connected to an input of said latch circuit means, for counting clock signals and generating the triggering signal when a predetermined count number of pulse edges of the clock signal has been counted; and a logic circuit means, connected to an output of said latch circuit means and to an input of said counter circuit means, for generating a signal which resets said counter circuit means while said latch circuit means and the input signal have the same logic state, and activates said counter circuit means when the logic states are complementary.

2. A noise pulse suppressing circuit according to claim 1, wherein said latch circuit means comprises a D-type flip-flop and said counter circuit means comprises a plurality of D-type flip-flops each having a data input terminal, a clock terminal, a data output terminal, an inverted output terminal and a reset terminal, whereby each data input terminal of said counter circuit means is connected to the inverted output terminal of the flip-flop and each inverted output terminal is also connected to the clock terminal of the following flip-flop except the last flip-flop, and the data output terminal of the last flip-flop is connected to a clock terminal of said latch circuit means.

3. A noise pulse suppressing circuit according to claim 2, wherein said logic circuit means comprises:
   an INVERTER
   a first NAND gate for receiving the output signal from said latch circuit means and an inverted signal of the input signal through said INVERTER;
   a second NAND gate for receiving the input signal and an inverted output signal from said latch circuit means;
   a third NAND gate for receiving outputs from said first and second NAND gates and outputting a signal to each reset terminal of said flip-flops of said counter circuit means; and
   a fourth NAND gate for receiving the clock signal and the output signal from third NAND gate, whereby an output signal from said fourth NAND gate is inputted to the clock terminal of the first flip-flop of said counter circuit means.

4. A noise pulse suppressing circuit according to claim 2, wherein said logic circuit means comprises:
   first and second INVERTERs;
   a first NAND gate for receiving the output signal from said latch circuit means and an inverted signal of the input signal through said first INVERTER;
   a second NAND gate for receiving the input signal and an inverted output signal from said latch circuit means;
   a third NAND for receiving outputs from said first and second NAND gates and outputting a signal to each reset terminal of said flip-flops of said counter circuit means;

said second INVERTER receiving an output signal from said third NAND gate; and an OR gate for receiving the clock signal and the output signal from said second INVERTER, whereby an output signal from said OR gate is inputted to the clock terminal of the first flip-flop of said counter circuit means.

5. A noise pulse suppressing circuit according to claim 3, wherein said counter circuit means comprises two D-type flip-flops, whereby the output signal is delayed with respect to the input signal, until the second trailing edge of the clock signal.

6. A noise pulse suppressing circuit according to claim 4, wherein said counter circuit means comprises two D-type flip-flops, whereby the output signal is delayed with respect to the input signal until the second leading edge of the clock signal.

7. A noise pulse suppressing circuit according to claim 3, wherein said counter circuit means comprises three D-type flip-flops, whereby the output signal is delayed with respect to the input signal until the fourth trailing edge of the clock signal.

8. A noise pulse suppressing circuit according to claim 4, wherein said counter circuit means comprises three D-type flip-flops, whereby the output signal is delayed with respect to the input signal until the fourth leading edge of the clock signal.

9. A noise pulse suppressing circuit according to claim 2, wherein said counter circuit means comprises N D-type flip-flops connected in cascade, whereby the output signal is delayed with respect to the input signal until the $2(N-1)$-th edge of the clock signal.

* * * * *